(12) United States Patent
Hwang et al.

(10) Patent No.: US 11,929,126 B2
(45) Date of Patent: Mar. 12, 2024

(54) MEMORY DEVICE AND OPERATING METHOD OF THE MEMORY DEVICE

(71) Applicant: SK hynix Inc., Icheon-si (KR)

(72) Inventors: Sung Hyun Hwang, Icheon-si (KR); Jae Yeop Jung, Icheon-si (KR); Se Chun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 252 days.

(21) Appl. No.: 17/675,925

(22) Filed: Feb. 18, 2022

(65) Prior Publication Data
US 2023/0108946 A1   Apr. 6, 2023

(30) Foreign Application Priority Data
Sep. 30, 2021   (KR) .................. 10-2021-0130339

(51) Int. Cl.
*G11C 16/04* (2006.01)
*G11C 16/10* (2006.01)
*G11C 16/24* (2006.01)
*G11C 16/34* (2006.01)

(52) U.S. Cl.
CPC ...... *G11C 16/3459* (2013.01); *G11C 16/0483* (2013.01); *G11C 16/10* (2013.01); *G11C 16/24* (2013.01)

(58) Field of Classification Search
CPC ...................................................... G11C 16/04
See application file for complete search history.

(56) References Cited

U.S. PATENT DOCUMENTS

2018/0082731 A1*   3/2018   Lee .................. G11C 29/34

FOREIGN PATENT DOCUMENTS

KR    1020150130636 A    11/2015
KR        101762828 B1    7/2017

* cited by examiner

*Primary Examiner* — Jason Lappas
(74) *Attorney, Agent, or Firm* — William Park & Associates Ltd.

(57) ABSTRACT

A memory device, and a method of operating the memory device, includes a memory block in which a plurality of cell pages are coupled to each of word lines. The memory device also includes a peripheral circuit configured to adjust a time point at which a verify voltage is applied to a selected word line among the word lines according to an order of performing a program operation during a verify operation of a selected cell page. The memory device further includes a control logic circuit configured to transmit, to the peripheral circuit, an operation code for adjusting a time point at which the verify voltage is output.

19 Claims, 15 Drawing Sheets

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2021-0130339, filed on Sep. 30, 2021, in the Korean Intellectual Property Office, the entire disclosure of which is incorporated herein by reference.

BACKGROUND

1. Technical Field

Various embodiments of the present disclosure generally relate to a memory device and a method of operating the memory device, and more particularly, to a memory device including a three-dimensionally structured memory block and a program operation of the memory device.

2. Related Art

A memory system may include a memory device storing data and a controller controlling the memory device. The memory device may be generally classified as a volatile memory device or a non-volatile memory device.

The memory device may include a memory cell array storing data, a peripheral circuit configured to perform a program, read, or erase operation on memory cells included in the memory cell array, and a control logic circuit controlling the peripheral circuit.

The memory cell array may include a plurality of memory blocks that have a three-dimensional structure, and each of the plurality of memory blocks may include a plurality of memory cells. The plurality of memory blocks that have the three-dimensional structure may include a plurality of memory cells that are stacked on each other. As integration density of the memory device increases, a distance between the memory cells may decrease. Accordingly, interference between the memory cells or between metal lines may increase.

SUMMARY

According to an embodiment, a memory device may include a memory block in which a plurality of cell pages are coupled to each of word lines. The memory device may also include a peripheral circuit configured to adjust a time point at which a verify voltage is applied to a selected word line among the word lines according to an order of performing a program operation during a verify operation of a selected cell page. The memory device may further include a control logic circuit configured to transmit, to the peripheral circuit, an operation code for adjusting a time point at which the verify voltage is output.

According to an embodiment, a method of operating a memory device may include applying a program voltage to a selected word line to increase a threshold voltage of selected memory cells among a plurality of memory cells that are coupled to the selected word line. The method may also include applying a pass voltage to unselected word lines during a verify operation for sensing a state of the selected memory cells. The method may further include adjusting, after applying the pass voltage, a time point at which a verify voltage is applied to the selected word line according to an order of performing a program operation of the selected memory cells. The method may additionally include applying the verify voltage to the selected word line according to the time point that is adjusted.

DETAILED DESCRIPTION

Specific structural or functional descriptions disclosed herein are merely illustrative for the purpose of describing embodiments according to the concept of the present disclosure. Embodiments according to the concept of the present disclosure may be implemented in various forms, and should not be construed as being limited to the specific embodiments set forth herein.

Various embodiments are directed to a memory device capable of improving reliability of a verify operation that is performed in a program operation of the memory device and a method of operating the memory device.

Figure 1:
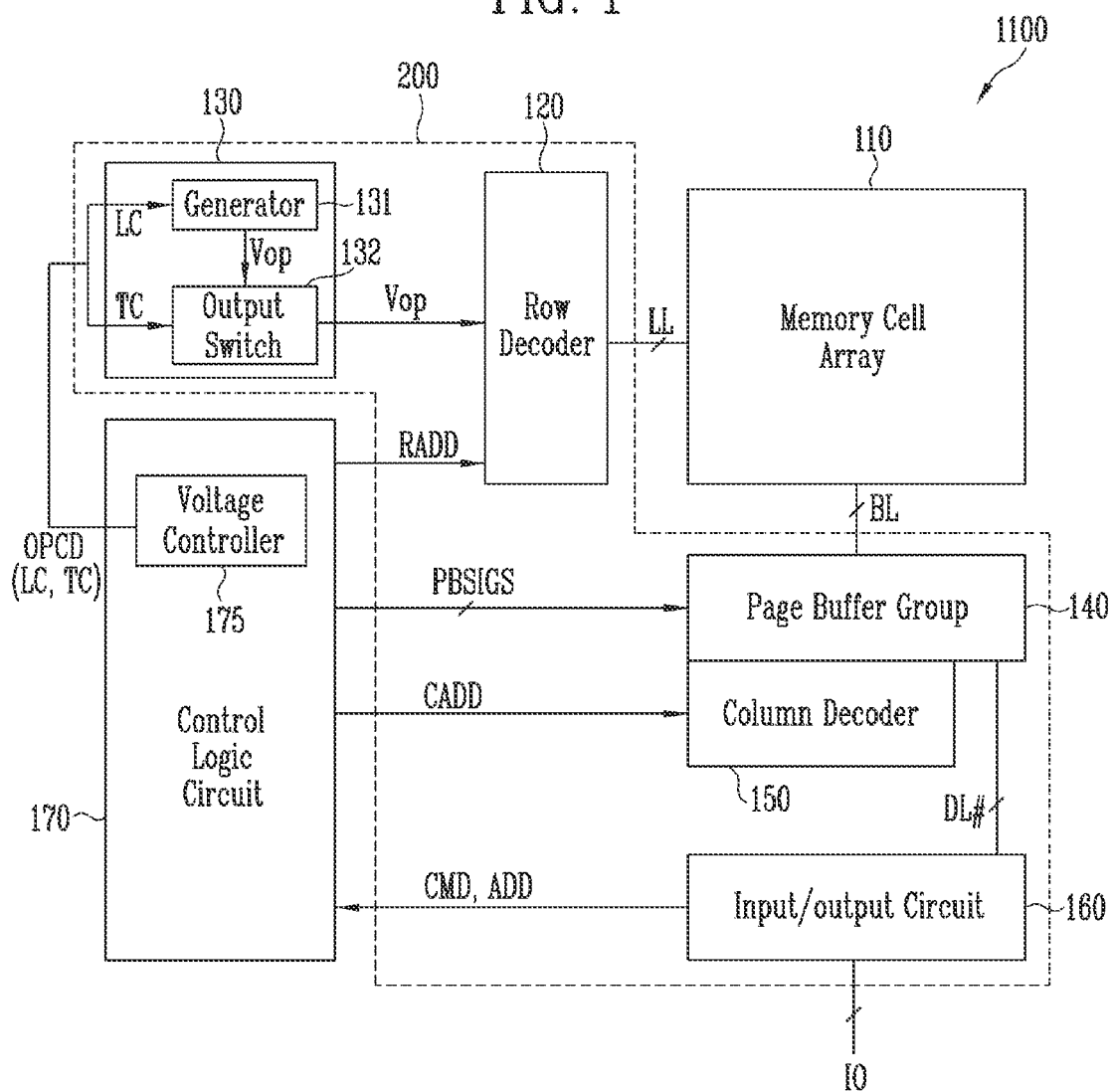
FIG. 1. is a diagram illustrating a memory device according to an embodiment.

FIG. 1 is a diagram illustrating a memory device 1100 according to an embodiment.

Referring to FIG. 1, the memory device 1100 may include a memory cell array 110 storing data, a peripheral circuit 200 configured to perform a program, read, or erase operation, and a control logic circuit 170 capable of controlling the peripheral circuit 200.

The memory cell array 110 may include a plurality of memory blocks storing data. Each of the plurality of memory blocks may include a plurality of memory cells, and the plurality of memory cells may have a two-dimensional structure where the memory cells are arranged parallel to a substrate or a three-dimensional structure where the memory cells are stacked in a vertical direction perpendicular to the substrate.

The peripheral circuit 200 may include a row decoder 120, a voltage generator 130, a page buffer group 140, a column decoder 150, and an input/output circuit 160.

The row decoder 120 may select one memory block among the memory blocks included in the memory cell array 110 in response to a row address RADD and may transmit operating voltages Vop to the selected memory block through local lines LL. For example, the local lines LL may include word lines, drain selection lines, source selection lines, and a source line.

The voltage generator 130 may generate and output the operating voltages Vop used to perform various operations in response to an operation code OPCD. For example, the voltage generator 130 may generate a program voltage, a verify voltage, a pass voltage, a read voltage, an erase voltage, a turn-on voltage, a turn-off voltage, and the like, and may also generate a negative voltage in response to the operation code OPCD. The operation code OPCD may include a level code LC for setting a level of a voltage used to perform an operation and a time code TC for setting a time point at which a generated voltage is output. For example, the voltage generator 130 may include a generator 131 configured to generate the operating voltages Vop having a set level in response to the level code LC and an output switch 132 configured to selectively output the operating voltages Vop at a set time in response to the time code TC.

The generator 131 may be configured to generate the operating voltages Vop having the set level in response to the level code LC included in the operation code OPCD. For example, the generator 131 may include a plurality pumps (not shown) that may generate the operating voltages Vop having various levels. For example, during a verify operation performed in a program operation, the generator 131 may generate a pass voltage and a verify voltage that are set according to the level code LC and may transmit the generated pass voltage and the generated verify voltage to the output switch 132.

The output switch 132 may be configured to receive the operating voltages Vop generated by the generator 131 and to selectively output the operating voltages Vop according to the time code TC included in the operation code OPCD. For example, during the verify operation, the output switch 132 may be configured to output a pass voltage at a time set according to the time code TC and to output a verify voltage at a time set according to the time code TC. For example, the output switch 132 may be configured to output a verify voltage at different times set according to the time code TC.

The page buffer group 140 may be coupled to the memory cell array 110 through bit lines BL. For example, the page buffer group 140 may include page buffers coupled to the bit lines BL in a one-to-one manner. The page buffers may simultaneously operate in response to page buffer control signals PBSIGS and may temporarily store data during a program or read operation. The page buffers may be configured to sense a current or a voltage of bit lanes that varies depending on a threshold voltage of memory cells during a verify operation or a read operation and to store sensed data.

The column decoder 150 may transmit data DATA between the input/output circuit 160 and the page buffer group 140 in response to a column address CADD.

The input/output circuit 160 may be coupled to an external device through input/output lines IO, and receive or output a command CMD, an address ADD, and the data DATA from or to the external device through the input/output lines IO. The external device may be a controller that may control the memory device 1100. For example, the input/output circuit 160 may transmit the command CMD and the address ADD that are received from the controller through the input/output lines IO to the control logic circuit 170 and may transmit the data DATA that is received from the external device through the input/output lines IO to the page buffer group 140 through data lines DL. The input/output circuit 160 may output the data DATA that is received through the data lines DL to the external device through the input/output lines IO.

The control logic circuit 170 may output the operation code OPCD, the row address RADD, the page buffer control signals PBSIGS, and the column address CADD in response to the command CMD and the address ADD. For example, the control logic circuit 170 may include software that executes an algorithm in response to the command CMD and hardware that is configured to output various signals according to the address ADD and the algorithm. The control logic circuit 170 may include a voltage controller 175 configured to output the operation codes OPCD during a program, read, or erase operation. The voltage controller 175 may be configured to output the operation code OPCD including the level code LC and the time code TC in response to the command CMD. For example, the level code LC is generated for setting a level of a verify voltage to be applied to a selected word line. The time code TC is generated for setting a time point at which the verify voltage is output.

Figure 2:
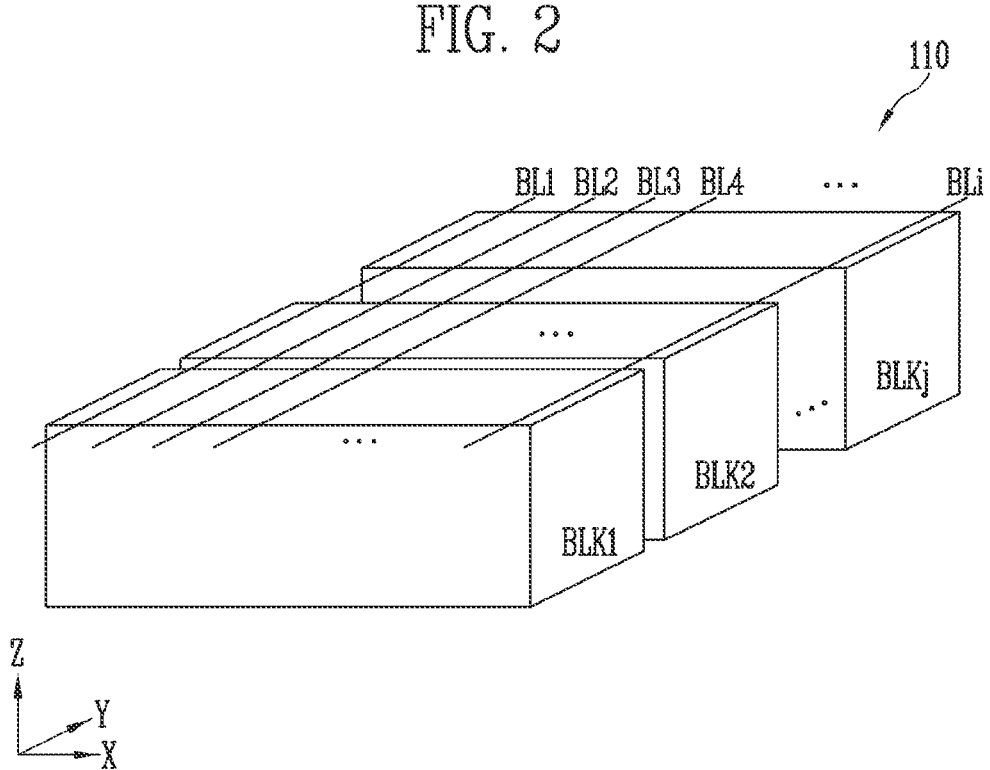
FIG. 2 is a diagram illustrating memory blocks according to an embodiment.

FIG. 2 is a diagram illustrating memory blocks according to an embodiment.

Referring to FIG. 2, the memory cell array 110 shown in FIG. 1 may include first to jth memory blocks BLK1 to BLKj, where j is a positive integer. For example, when it is assumed that first to ith bit lines BL1 to BLi are arranged to be spaced apart from each other in a first direction X, the first to jth memory blocks BLK1 to BLKj may be arranged to be spaced apart from each other in a second direction Y, where i is a positive integer. When the first to jth memory blocks BLK1 to BLKj have a three-dimensional structure, the first to jth memory blocks BLK1 to BLKj may share the first to ith bit lines BL1 to BLi. Each of the first to jth memory blocks BLK1 to BLKj may include a plurality of memory cells that are stacked in a third direction Z. The first to jth memory blocks BLK1 to BLKj may be disposed above the peripheral circuit 200 shown in FIG. 1 or above a substrate. A structure of the first to jth memory blocks BLK1 to BLKj is described below in more detail.

Figure 3:
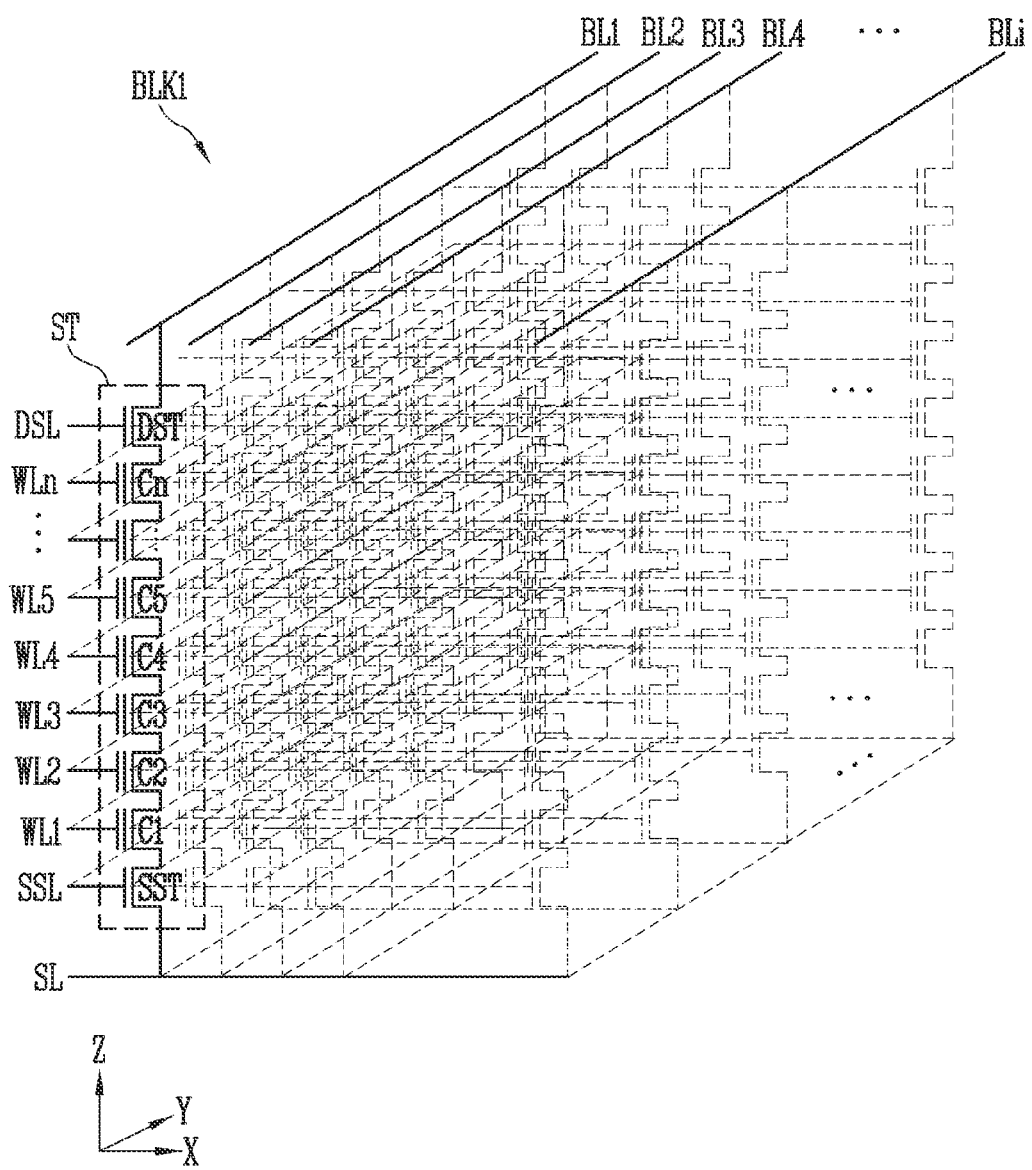
FIG. 3 is a circuit diagram illustrating a memory block according to an embodiment.

FIG. 3 is a circuit diagram illustrating a memory block according to an embodiment.

Referring to FIG. 3, because the first to jth memory blocks BLK1 to BLKj have the same configuration, the first memory block BLK1 is illustrated as an embodiment among the first to jth memory blocks BLK1 to BLKj shown in FIG. 2.

The first memory block BLK1 may include a plurality of strings ST coupled between the first to ith bit lines BL1 to BLi and a source line SL. For example, the plurality of strings ST may be coupled to each of the first to ith bit lines BL1 to BLi and the plurality of strings ST may be coupled in common to the source line SL.

One of the plurality of strings ST which is coupled to the first bit line BL1 is described as an example below among the plurality of strings ST.

The string ST coupled to the first bit line BL1 may include a source selection transistor SST, first to nth memory cells C1 to Cn, and a drain selection transistor DST coupled in series between the source line SL and the first bit line BL1. FIG. 3 illustrates that one source selection transistor SST and one drain selection transistor DST are included in the string ST. However, a plurality of source selection transistors SST and a plurality of drain selection transistors DST may be included in the string ST depending on a memory block. The source selection transistor SST nay be configured to couple the first memory cell C1 to the source line SL or to block the connection between the first memory cell C1 and the source line SL. The drain selection transistor DST may be configured to couple the nth memory cell Cn to the first bit line BL1 or to block the connection between the nth memory cell Cn and the first bit line BL1. The first to nth memory cells C1 to Cn may be configured to store data.

Gates of the source selection transistors SST included in different strings ST may be coupled in common to a source selection line SSL. However, the gates of the source selection transistors SST included in different strings ST may also be configured to be coupled to different source selection lines depending on a memory block. Gates of the first to nth memory cells C1 to Cn included in different strings ST may be coupled to first to nth word lines WL1 to WLn. For example, gates of the first memory cells C1 included in different strings ST may be coupled in common to the first word line WL1 and gates of the second memory cells C2 included in different strings ST may be coupled in common to the second word line WL2. In the above-described manner, gates of the nth memory cells Cn included in different strings ST may be coupled in common to the nth word line WLn. Gates of the drain selection transistors DST included in different strings ST may be coupled to the drain selection lines DSL and some of the drain selection transistors DST may be coupled to the same drain selection line DSL. For example, gates of the drain selection transistors DST arranged in the first direction X among the drain selection transistors DST may be coupled to the same drain selection line DSL and gates of the drain selection transistors DST arranged in the second direction Y among the drain selection transistors DST may be coupled to the different drain selection lines DSL.

A group of memory cells coupled to the same word line among the first to nth memory cells C1 to Cn may form a page. The page may be a unit of memory selected during a program operation or a read operation. The page is described below in detail.

Figure 4:
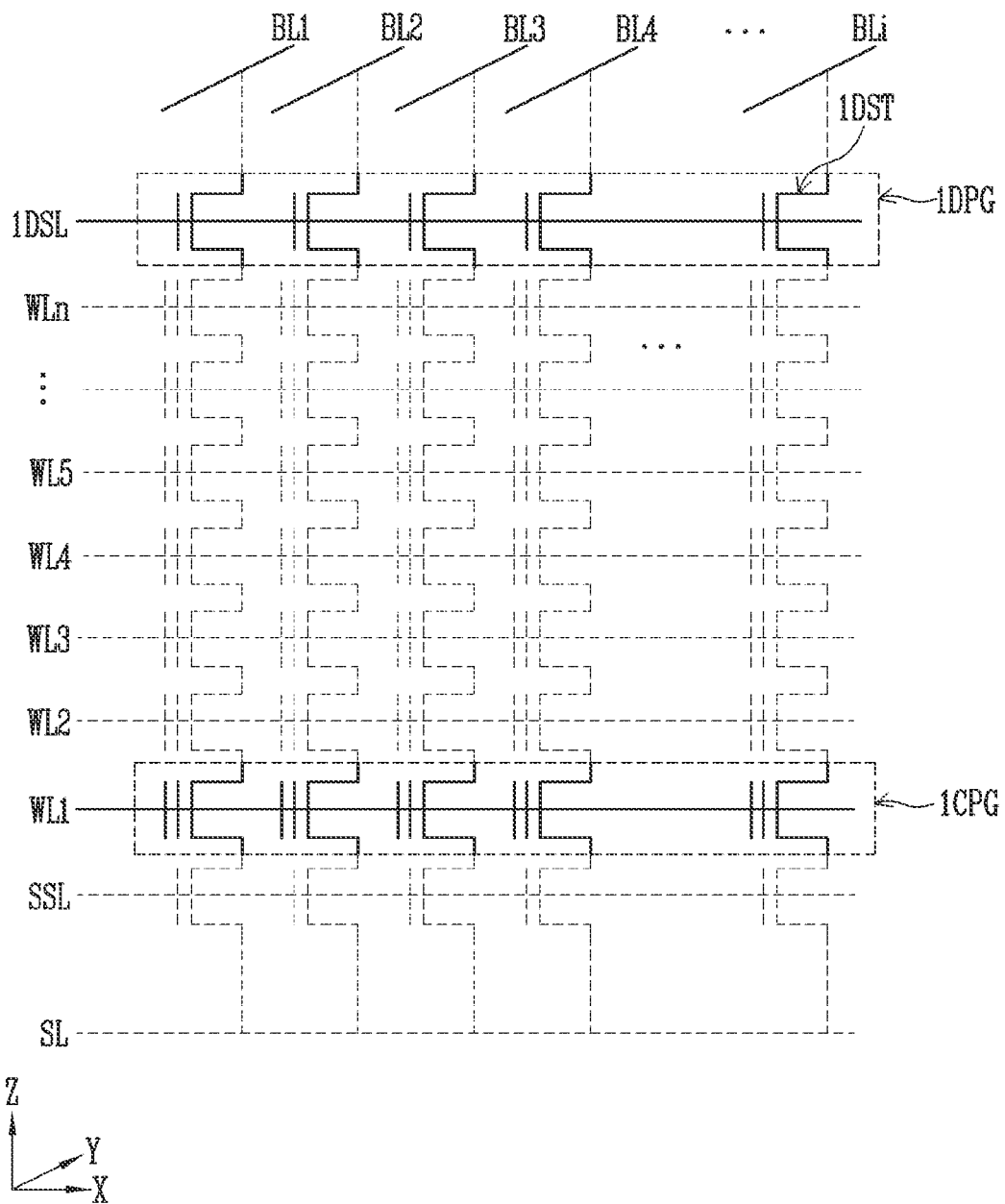
FIG. 4 is a diagram illustrating a cell page selected by the same drain selection line.

FIG. 4 is a diagram illustrating a cell page selected by the same drain selection line.

Referring to FIG. 4, the page which is a group of memory cells that are coupled to the same word line may include a plurality of cell pages. A cell page may be a group of memory cells that are included in strings that include drain selection transistors coupled to the same drain selection line. For example, it is assumed that a group of drain selection transistors that are coupled to a first drain selection line 1DSL among drain selection transistors that are coupled to the first to ith bit lines BL1 to BLi is a first drain page 1DPG. A group of memory cells that are included in the same strings as the first drain page DPG and that are coupled to a selected word line may be defined as a cell page. In other words, a group of all memory cells that are coupled to the first word line WL1 may be defined as a first page, and a group of memory cells that are included in the same strings as the first drain page 1DPG among memory cells included in the first page may be defined as a first cell page 1CPG. Accordingly, the first page may include a plurality of cell pages. The cell pages may be selected depending on a drain page. For example, when the first drain page 1DPG is selected among the plurality of drain pages and the first word line WL1 is selected among the plurality of word lines WL1 to WLn, the first cell page 1CPG may be selected.

Figure 5:
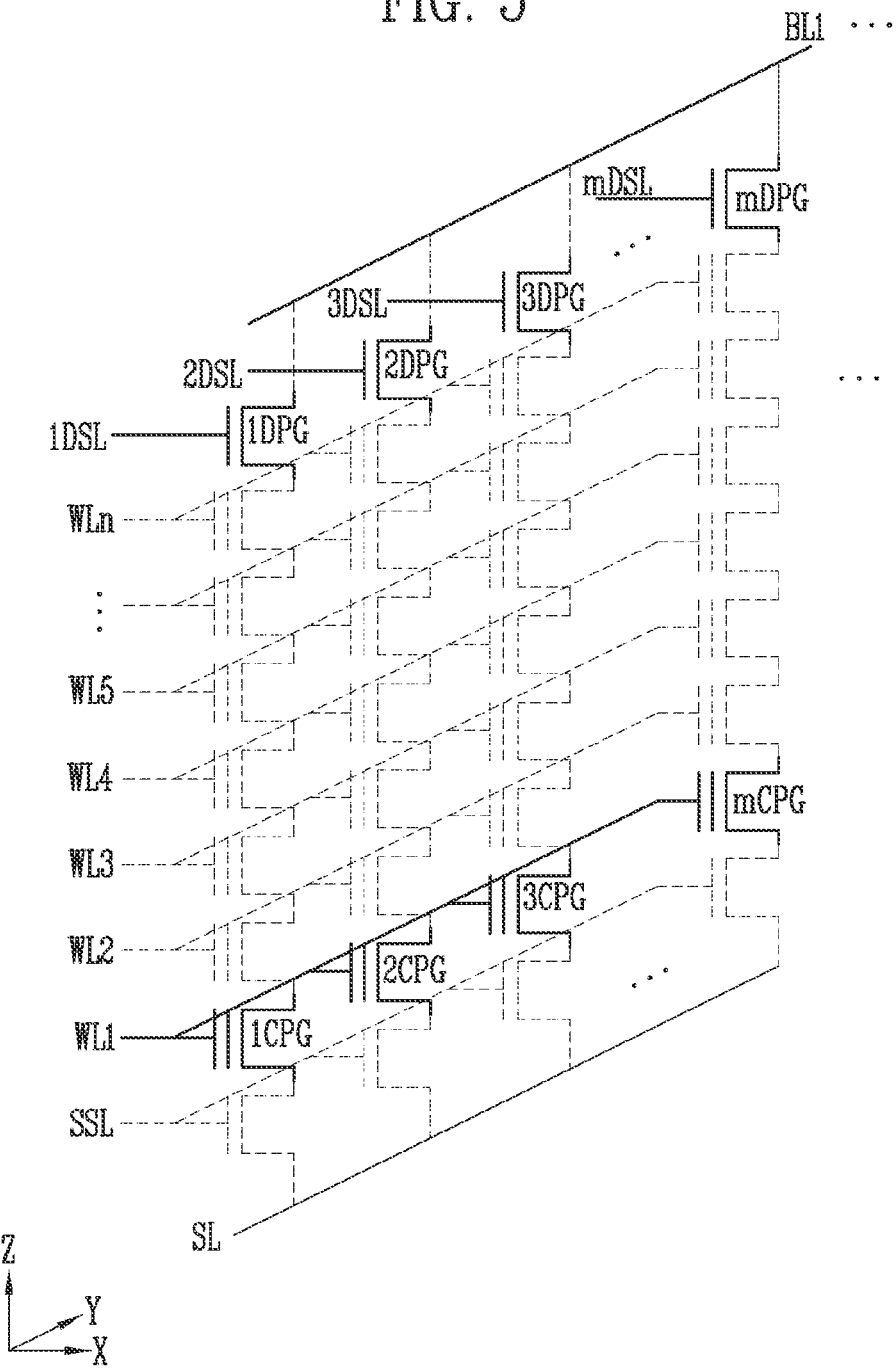
FIG. 5 is a diagram illustrating memory cells selected by different drain selection lines.

FIG. 5 is a diagram illustrating memory cells selected by different drain selection lines.

Referring to FIG. 5, when it is assumed that m strings are coupled to the same bit line, first to mth drain pages 1DPG to mDPG may be coupled to the same bit line. The first to mth drain pages 1DPG to mDPG may be coupled to different drain selection lines 1DSL to mDSL in a one-to-one manner. For example, gates of drain selection transistors included in the first drain page 1DPG may be coupled in common to the first drain selection line 1DSL, and gates of drain selection transistors included in the second drain page 2DPG may be coupled in common to a second drain selection line 2DSL. In the above-described manner, gates of drain selection transistors included in the mth drain page mDPG may be coupled in common to the mth drain selection line mDSL.

Memory cells coupled to the first word line WL1 may form first to mth cell pages 1CPG to mCPG. The first cell page 1CPG may correspond to the first drain page 1DPG and the second cell page 2CPG may correspond to the second drain page 2DPG. In the above-described manner, the mth cell page mCPG may correspond to the mth drain page mDPG. Accordingly, a cell page corresponding to a selected drain page among the first to mth cell pages 1CPG to mCPG may be finally determined as a selected cell page. For example, when the first word line WL1 is selected and when a turn-on voltage is applied to the first drain selection line 1DSL and a turn-off voltage is applied to the second to mth drain selection lines 2DSL to mDSL, the first cell page 1CPG may be a selected cell page and the remaining cell pages, that is, the second to mth cell pages 2CPG to mCPG except for the first cell page 1CPG may be unselected cell pages. A program or read operation may be performed in units of cell pages selected according to a word line and a drain page.

An order of performing program operations according to an embodiment is described below in detail with reference to the following diagram.

Figure 6:
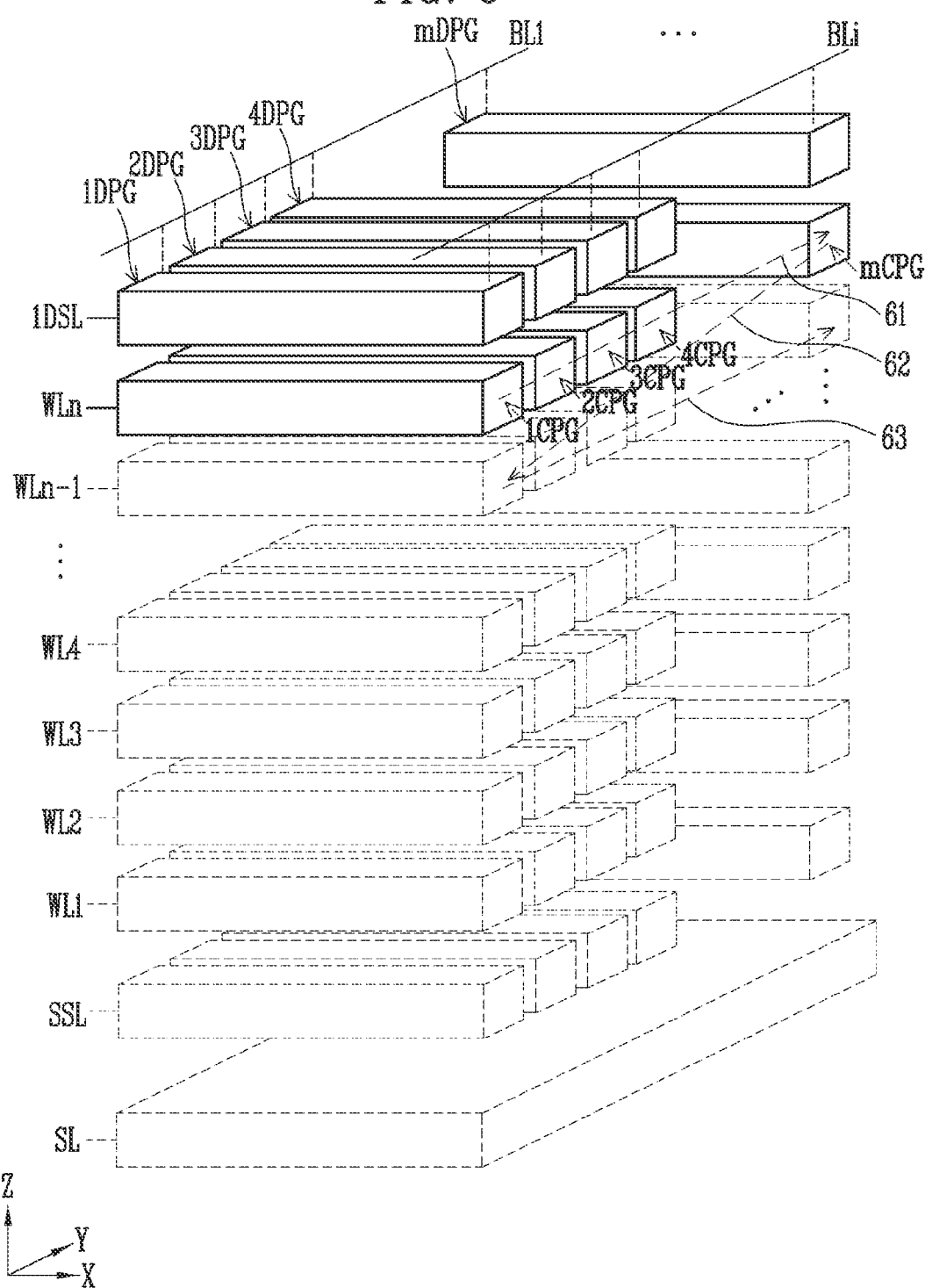
FIG. 6 is a diagram illustrating an order of performing program operations according to an embodiment.

FIG. 6 is a diagram illustrating an order of performing program operations according to an embodiment.

Referring to FIG. 6, the program operations according to an embodiment may be performed in units of cell pages. In other words, when a word line is selected, cell pages coupled to the selected word line might not be simultaneously selected but the cell pages coupled to the selected word line may be sequentially selected according to selected drain pages. For example, the program operations may be performed in an order from the nth word line WLn to the first word line WL1, and in the selected word line, the program operations may be performed in an order of selecting drain pages. For example, the first to mth cell pages 1CPG to mCPG coupled in common to the nth word line WLn may be sequentially selected in an order of selecting the first to mth drain pages 1DPG to mDPG. When program operations of the first to mth cell pages 1CPG to mCPG coupled to the nth word line WLn are completed (61), the (n−1)th word line WLn−1 adjacent to the nth word line WLn may be selected (62). Cell pages coupled in common to the (n−1)th word line WLn−1 may be sequentially selected according to an order of selecting the first to mth drain pages 1DPG to mDPG (63). Because program operations are performed on cell pages that are sequentially selected, the program operations may be performed in the second direction Y in a selected word line. When the program operations of the cell pages included in the selected word line are completed, program operations may also be sequentially performed on cell pages, which are located in the third direction Z from a page on which the program operations are completed, in the second direction Y.

Figure 7:
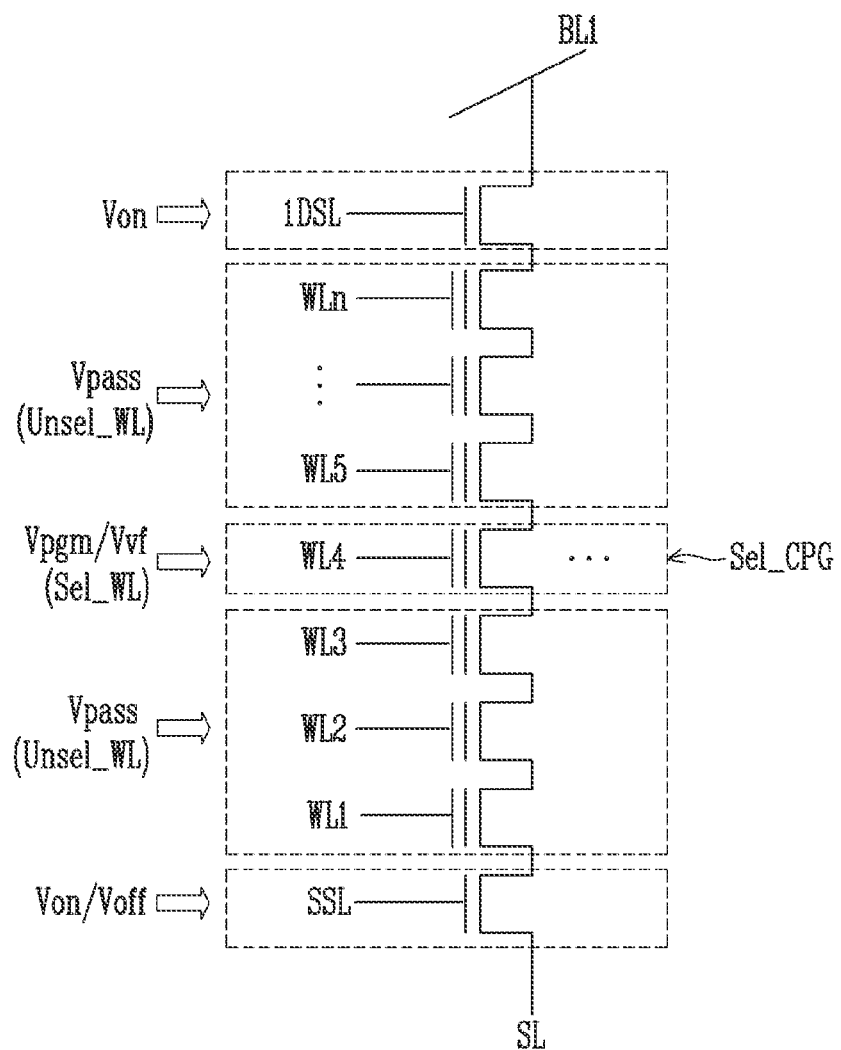
FIG. 7 is a diagram illustrating voltages that are applied to lines that are coupled to a selected memory block during a program operation according to an embodiment.

FIG. 7 is a diagram illustrating voltages that are applied to lines that are coupled to a selected memory block during a program operation according to an embodiment.

Referring to FIG. 7, when a program operation is performed on a selected cell page Sel_CPG coupled to a selected word line Sel_WL, a program voltage Vpgm or a verify voltage Vvf may be applied to the selected word line Sel_WL, and a pass voltage Vpass may be applied to unselected word lines Unsel_WL. The selected cell page Sel_CPG among cell pages coupled to the selected word line Sel_WL may be selected depending on a turn-on voltage Von applied to a selected drain selection line. For example, when the turn-on voltage Von is applied to the first drain selection line 1DSL, a cell page corresponding to the first drain selection line 1DSL may be selected among cell pages included in the selected word line Sel_WL. The turn-on voltage Von may be applied to the source selection line SSL. However, a turn-off voltage Voff may be applied to the source selection line SSL during a period in which a threshold voltage of memory cells is increased by the program voltage Vpgm.

In a program operation, after a threshold voltage of selected memory cells is increased by applying the program voltage Vpgm to the selected word line Sel_WL, a verify operation for determining whether the selected memory cells are programmed is performed. In the verify operation, the verify voltage Vvf may be applied to the selected word line Sel_WL and the pass voltage Vpass may be applied to the unselected word lines Unsel_WL.

Figure 8:
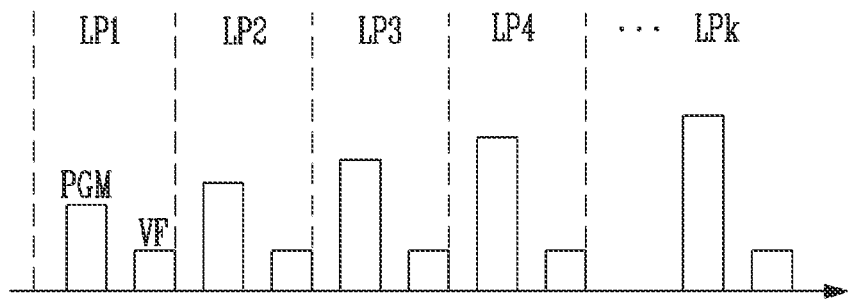
FIG. 8 is a diagram illustrating a program operation according to an embodiment.

FIG. 8 is a diagram illustrating a program operation according to an embodiment.

Referring to FIG. 8, the program operation may be performed by an incremental step pulse program (ISPP) scheme which gradually increases a program voltage. In the program operation performed by the ISPP scheme, a plurality of loops LP1 to LPk each including a program voltage applying operation PGM and a verify operation VF. For example, in a first loop LP1, the program voltage applying operation PGM using a first program voltage and the verify operation VF using a verify voltage may be sequentially performed. When a result of the verify operation VF of the first loop LP1 indicates failure, a second loop LP2 may be performed. A level of a program voltage used to perform a loop may be set to be higher than a level of a program voltage used to perform a previous loop, and a level of a program voltage may gradually increase each time a loop is performed. The plurality of loops LP1 to LPk may be performed until a result of the verify operation VF indicates success (pass). However, when a result of the verify operation VF indicates failure even when the number of times loops are performed reaches the maximum number, a selected memory block may be determined as a bad block.

In embodiments described hereinafter, a verify operation means an operation performed in a program operation. The verify operation VF between the program voltage applying operation PGM and the verify operation VF that are described above, the verify operation VF is described below in detail.

Figure 9:
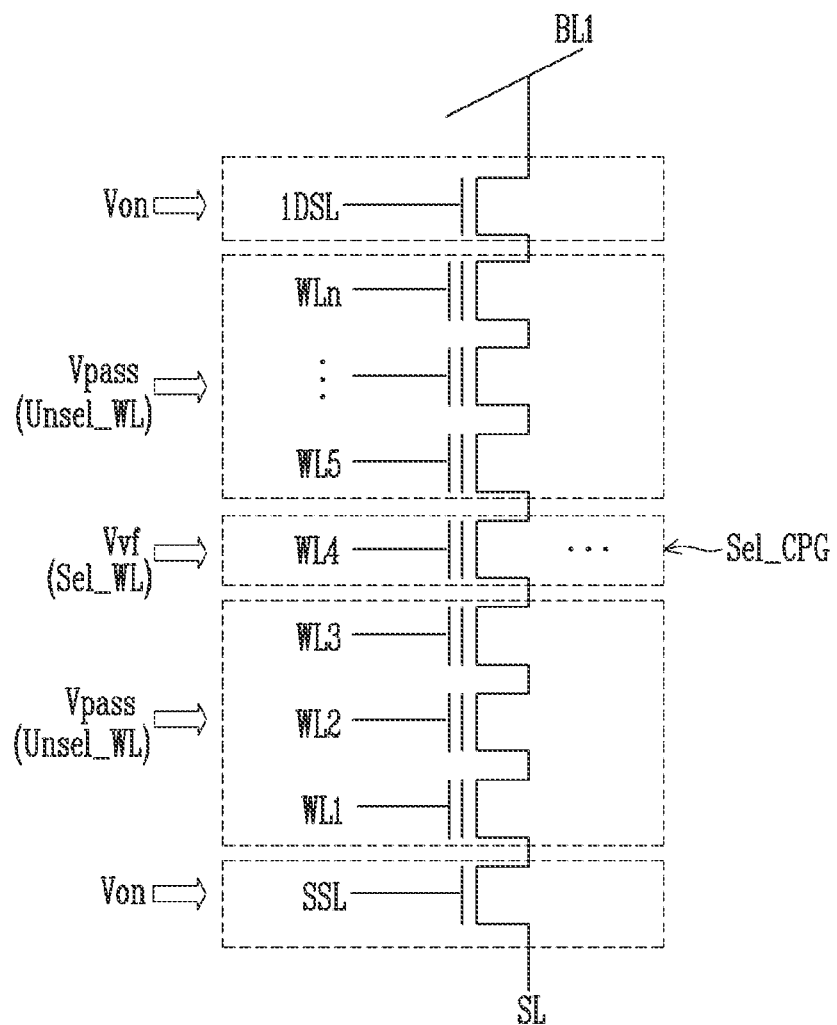
FIG. 9 is a diagram illustrating voltages that are applied to lines that are coupled to a selected memory block during a verify operation according to an embodiment.

FIG. 9 is a diagram illustrating voltages that are applied to lines that are coupled to a selected memory block during a verify operation according to an embodiment.

Referring to FIG. 9, when the verify operation starts, a precharge voltage may be applied to the first bit line BL1 and the turn-on voltage Von may be applied to the first drain selection line 1DSL and the source selection line SSL. FIG. 9 illustrates an embodiment of a string coupled to the first bit line BL1. However, the precharge voltage may be applied to all bit lines coupled to the selected memory block.

The pass voltage Vpass may be applied to the unselected word lines Unsel_WL, and subsequently the verify voltage Vvf may be applied to the selected word line Sel_WL, such that a verify operation of the selected cell page Sel_CPG corresponding to the first drain selection line 1DSL among memory cells coupled to the selected word line Sel_WL may be performed.

Because a plurality of memory cells are included in the selected memory block and a plurality of word lines are coupled to the plurality of memory cells, a voltage applied to the word lines may be affected by states of the memory cells. For example, when the number of memory cells in an erase state increases, a voltage applied to the word lines may increase to a target voltage more slowly. In the verify operation, the pass voltage Vpass applied to the unselected word lines Unsel_WL should reach to a target pass voltage. However, when the number of memory cells in the erase state increases, a time required for the pass voltage Vpass to reach the target pass voltage may increase. Accordingly, because a time required to perform a program operation may increase, according to an embodiment, a time point at which the verify voltage Vvf is applied and a time point at which the bit lines are precharged may be adjusted depending on the states of the memory cells during the verify operation. For example, the time point at which the bit lines are precharged may be the same as the time point at which the verify voltage Vvf is applied. The time point at which the verify voltage Vvf is applied and the time point at which the bit lines are precharged may be adjusted depending on the number of erase cells among memory cells included in the selected memory block or a size of selected memory cells.

Figure 10:
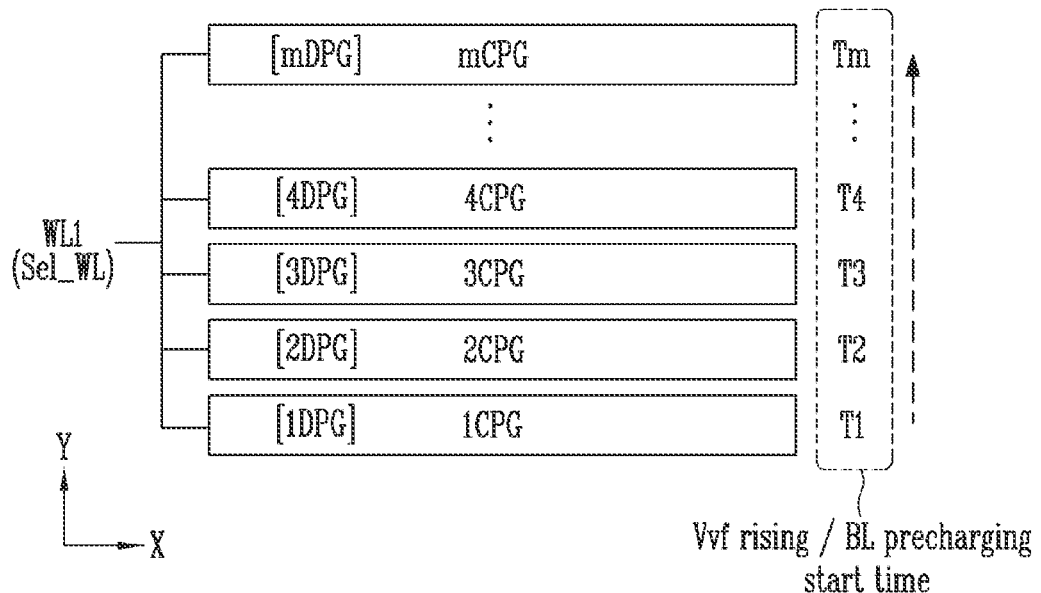
FIG. 10 is a diagram illustrating time points at which a verify voltage is applied to a selected word line during a verify operation of cell pages coupled to the same word line.

FIG. 10 is a diagram illustrating time points at which a verify voltage is applied to a selected word line during a verify operation of cell pages coupled to the same word line.

Referring to FIG. 10, the first to mth cell pages 1CPG to mCPG coupled to the same word line may be sequentially selected and programmed in an order of selecting the first to mth drain pages 1DPG to mDPG. By way of example, it is assumed that the first to mth cell pages 1CPG to mCPG are coupled to the first word line WL1 and that the first to mth cell pages 1CPG to mCPG correspond to the first to mth drain pages 1DPG to mDPG in a one-to-one manner.

Before the program operations of the first to mth cell pages 1CPG to mCPG start, all memory cells included in the first to mth cell pages 1CPG to mCPG may be in an erase state. Accordingly, when the program operations are performed in the second direction Y, the first drain page 1DPG may be selected first, and therefore the program operation of the first cell page 1CPG corresponding to the first drain page 1DPG may be performed first. When the program operation of the first cell page 1CPG is performed, memory cells in the erase state are the greatest in number in the first to mth cell pages 1CPG to mCPG. On the other hand, because the program operation of the mth cell page mCPG corresponding to the mth drain page mDPG is performed after the program operations of the first to (m−1)th cell pages 1CPG to (m−1)CPG are completed, memory cells in a program state are the greatest in number in the first to mth cell pages 1CPG to mCPG. In other words, when the program operation of the mth cell page mCPG is performed, memory cells in the erase state are the smallest in number in the first to mth cell pages 1CPG to mCPG.

Accordingly, according to an embodiment, a time point at which the verify voltage Vvf is applied to a selected word line is set to be the last time point among time points at which the verify voltage Vvf is applied to the selected word line when a program operation is performed in a state where memory cells in an erase state are the greatest in number among all memory cells, and a time point at which the verify voltage Vvf is applied to the selected word line may be set to be gradually earlier as the number of memory cells in the erase state decreases among all the memory cells.

For example, when the program operation of the first cell page 1CPG is performed, application of the verify voltage Vvf to the first word line WL1 may be set to start at a first time T1. The first time T1 may be the last time point among time points at which application of the verify voltage Vvf to the selected word line Sel_WL starts. For example, the first time T1 may be a time point at which the verify voltage Vvf is applied to the selected word line Sel_WL and which elapses from when the pass voltage Vpass is applied to the unselected word lines Unsel_WL. When the program operation of the first cell page 1CPG is performed, drain selection transistors included in the first drain page 1DPG may be turned on and drain selection transistors included in the remaining second to mth drain pages 2DPG to mDPG may be turned off.

When the program operation of the first cell page 1CPG is completed, the program operation of the second cell page 2CPG, which is adjacent to the first cell page 1CPG among the first to mth cell pages 1CPG to mCPG coupled to the first word line WL1, may be performed. When the program operation of the second cell page 2CPG is performed, all drain selection transistors included in the second drain page 2DPG may be turned on and all drain selection transistors included in the remaining drain pages, that is, the first drain page 1DPG and the third to mth drain pages 3DPG to mDPG may be turned off.

Because the program operation of the second cell page 2CPG is performed after the program operation of the first cell page 1CPG is completed, the number of memory cells in the erase state during the program operation of the second cell page 2CPG is smaller than that during the program operation of the first cell page 1CPG. Accordingly, when the program operation of the second cell page 2CPG is performed, after the pass voltage Vpass is applied to the unselected word lines, that is, the word lines except for the first word line WL1, application of the verify voltage Vvf to the first word line WL1 may be set to start at a second time T2 which is earlier than the first time T1.

When the program operations of the first to mth cell pages 1CPG to mCPG are performed in the above-described manner, the program operation of the mth cell page mCPG, which is the last cell page among the first to mth cell pages 1CPG to mCPG coupled to the first word line WL1, may be performed when memory cells in the erase state are the smallest in number among all the memory cells. In other words, when the program operation of the mth cell page mCPG is performed, because the pass voltage Vpass applied to the unselected word lines may be affected the least by the memory cells in the erase state, the pass voltage Vpass applied to the unselected word lines Unsel_WL during the program operation of the mth cell page mCPG may increase to a target level more quickly than the pass voltage Vpass applied to the unselected word lines Unsel_WL during the program operations of the cell pages other than the mth cell page mCPG. Accordingly, when the program operation of the mth cell page mCPG is performed, after the pass voltage Vpass is applied to the unselected word lines, that is, the word lines except for the first word line WL1, application of the verify voltage Vvf to the first word line WL1 may be set to start at an mth time Tm which is the earliest time point among the time points at which application of the verify voltage Vvf to the selected word line starts.

Figure 11:
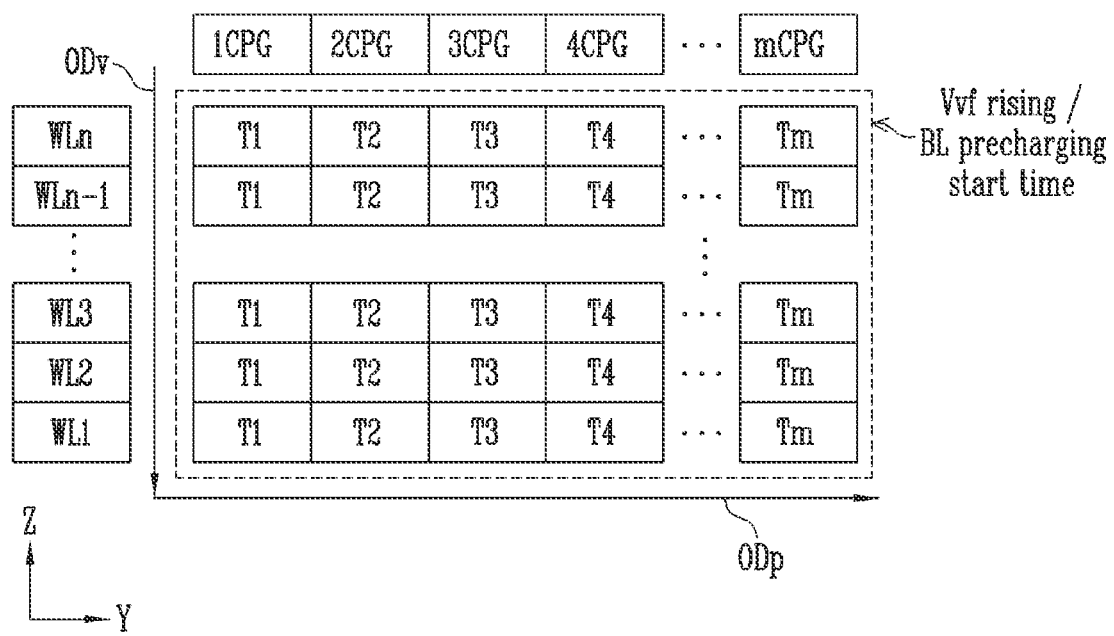
FIG. 11 is a diagram illustrating time points at which a verify voltage is applied to a selected word line during verify operations of cell pages coupled to different word lines.

FIG. 11 is a diagram illustrating time points at which a verify voltage is applied to a selected word line during verify operations of cell pages coupled to different word lines.

Referring to FIG. 11, in verify operations of the first to mth cell pages 1CPG to mCPG coupled to each of the first to nth word lines WL1 to WLn, time points at which the verify voltage Vvf starts to be applied to a selected word line may be adjusted depending on an order of performing program operations. For example, program operations of cell pages coupled to the selected word line may be performed in a horizontal direction ODp and program operations of cell pages coupled to different word lines may be performed in a vertical direction ODv.

For example, when the program operations of the first to mth cell pages 1CPG to mCPG coupled to the nth word line WLn are completed, the program operations of the first to mth cell pages 1CPG to mCPG coupled to the (n−1)th word line WLn−1 may be performed. Because the program operations of the first to mth cell pages 1CPG to mCPG coupled to the (n−1)th word line WLn−1 may also be sequentially performed in the second direction Y, during the verify operations, a time point at which the verify voltage Vvf starts to be applied to the selected word line may be set the same as the time point set during the verify operations of the first to mth cell pages 1CPG to mCPG coupled to the nth word line WLn, FIG. 12 is a diagram illustrating a method of operating a memory device according to a first embodiment.

Figure 12:
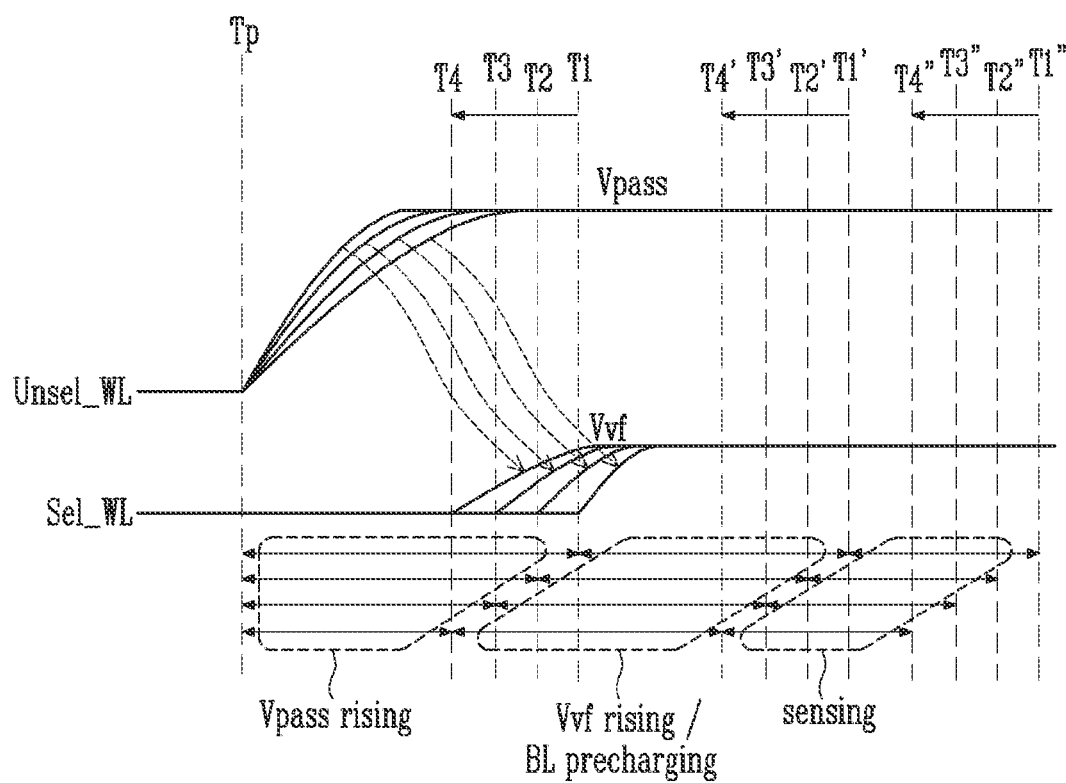
FIG. 12 is a diagram illustrating a method of operating a memory device according to a first embodiment.

Referring to FIG. 12, a verify operation may include an operation in which a pass voltage rises Vpass rising, an operation in which a verify voltage rises Vvf rising, an operation in which a bit line is precharged BL precharging, and an operation of sensing sensing. In the operation in which the pass voltage rises Vpass rising, the pass voltage Vpass may be applied to the unselected word lines Unsel_WL. The operation in which the verify voltage rises Vvf rising and the operation in which the bit line is precharged BL precharging may be performed at the same time. In the operation in which the verify voltage rises Vvf rising, the verify voltage Vvf may be applied to the selected word line Sel_WL. In the operation in which the bit line is precharged BL precharging, a precharge voltage which is a positive voltage may be applied to all bit lines or selected bit lines. In the operation of sensing sensing, threshold voltages of selected memory cells may be sensed.

In a verify operation according to the first embodiment, the first time T1, the second time T2, a third time 13, and a fourth time T4 at which the verify voltage Vvf is applied to the selected word line Sel_WL may be set to have a uniform interval between adjacent times from a time Tp at which the pass voltage Vpass starts to be applied to the unselected word lines Unsel_WL, each time a selected cell page is changed. For example, the number of memory cells in an erase state among memory cells of cell pages coupled to the selected word line Sel_WL is the greatest when a program operation of the first cell page among the cell pages coupled to the selected word line Sel_WL is performed, and the number of memory cells in the erase state among the memory cells of the cell pages coupled to the selected word line Sel_WL is the smallest when a program operation of the last cell page among the cell pages coupled to the selected word line Sel_WL is performed. When it is assumed that four cell pages are coupled to the selected word line Sel_WL, during a verify operation of the first cell page, a time point at which the verify voltage Vvf is applied to the selected word line Sel_WL may be set to the first time T1 which is the latest time point from the time Tp at which the pass voltage Vpass is applied. During a verify operation of the last cell page, a time point at which the verify voltage Vvf is applied to the selected word line Sel_WL may be set to the fourth time T4 which is the earliest time point from the time Tp at which the pass voltage Vpass is applied. In other words, when the number of memory cells in the erase state increases, a time required for the pass voltage Vpass applied to the unselected word lines Unsel_WL to reach a target level increases, and therefore a later time point may be set as a time point at which the verify voltage Vvf starts to be applied to the selected word line Sel_WL. On the other hand, when the number of memory cells in the erase state decreases, a time required for the pass voltage Vpass applied to the unselected word lines Unsel_WL to reach a target level decreases, and therefore an earlier time point may be set as a time point at which the verify voltage Vvf starts to be applied to the selected word line Sel_WL.

In the verify operation according to the first embodiment, an interval between the first time T. and the second time T2, an interval between the second time T2 and the third time 13, and an interval between the third time T3 and the fourth time T4 may be set to be the same. After the pass voltage Vpass is applied to the unselected word lines Unsel_WL, the verify voltage Vvf may be applied to the selected word line Sel_WL.

When the operation in which the verify voltage rises Vvf rising and the operation in which the bit line is precharged BL precharging start at a time selected among the first to fourth times T1 to T4, an end time may vary depending on a start time. For example, after the pass voltage Vpass is applied to the unselected word lines Unsel_WL at the time TP, the verify voltage Vvf may be applied to the selected word line Sel_WL and the precharge voltage may be applied to the bit lines BL at the first time T1. When the precharge voltage is applied to the bit lines BL, a turn-on voltage may be applied to a drain selection line corresponding to the selected cell page. A voltage which enables drain selection transistors coupled to the drain selection line to be turned on may be set as the turn-on voltage.

Even when the start time of the operation in which the verify voltage rises Vvf rising and the operation in which the bit line is precharged BL precharging varies, the operation in which the verify voltage rises Vvf rising and the operation in which the bit line is precharged BL precharging may be performed for a uniform time period. Accordingly, the earlier the start time of the operation in which the verify voltage rises Vvf rising and the operation in which the bit line is precharged BL precharging is, the earlier the end time, which is one of times T1', T2', T3', and T4', of the operation in which the verify voltage rises Vvf rising and the operation in which the bit line is precharged BL precharging is. The end time, which is one of the times T1', T2', T3', and T4', of the operation in which the verify voltage rises Vvf rising and the operation in which the bit line is precharged BL precharging may be a start time of the operation of sensing sensing. Because the operation of sensing sensing is performed for a uniform time period, the earlier the start time, which is one of the times T1', T2', T3', and T4', of the operation of sensing sensing is, the earlier an end time, which is one of times T1", T2", T3", and T4", of the operation of sensing sensing is. Similarly, the later the start time, which is one of the times T1', T2', T3', and T4', of the operation of sensing sensing is, the later the end time, which is one of the times T1", T2", T3", and T4", of the operation of sensing sensing is.

As described above, as the program operations of cell pages coupled to the selected word line Sel_WL proceed and the number of cell pages on which the program operation is performed increases, the number of memory cells in the erase state decreases. Accordingly, the end time of the operation of sensing sensing may also be advanced, thereby reducing a program operation time of selected cell pages.

Figure 13:
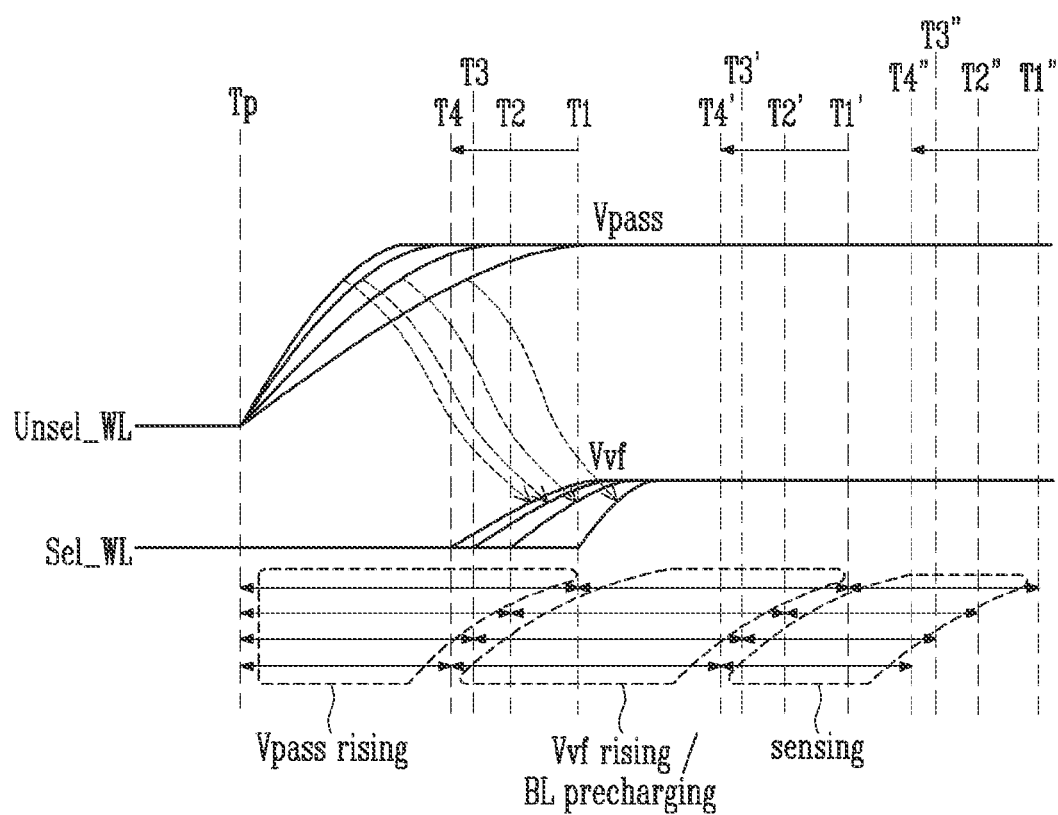
FIG. 13 is a diagram illustrating a method of operating a memory device according to a second embodiment.

FIG. 13 is a diagram illustrating a method of operating a memory device according to a second embodiment.

Referring to FIG. 13, in a verify operation according to the second embodiment, the first to fourth times T1, T2, T3, and T4 at which the verify voltage Vvf is applied to the selected word line Sel_WL may be set to be gradually earlier from the time Tp at which the pass voltage Vpass starts to be applied to the unselected word lines Unsel_WL each time a selected cell page is changed.

In the verify operation according to the second embodiment, when it is assumed that an interval between the first time T1 and the second time T2 is the greatest among intervals between adjacent times among the first to fourth times T1, T2, T3, and T4, an interval between the second time T2 and the third time T3 may be smaller than the interval between the first time T1 and the second time T2 and an interval between the third time 13 and the fourth time 14 may be smaller than the interval between the second time T2 and the third time T3.

When the operation in which the verify voltage rises Vvf rising and the operation in which the bit line is precharged BL precharging start at a time selected among the first to fourth times T1 to T4, an end time may vary depending on a start time. For example, after the pass voltage Vpass is applied to the unselected word lines Unsel_WL, the verify voltage Vvf may be applied to the selected word line Sel_WL and a precharge voltage may be applied to the bit lines BL at the first time T1. When the precharge voltage is applied to the bit lines BL, a turn-on voltage may be applied to a drain selection line corresponding to a selected cell page. A voltage which enables drain selection transistors coupled to the drain selection line to be turned on may be set as the turn-on voltage.

Even when the start time of the operation in which the verify voltage rises Vvf rising and the operation in which the bit line is precharged BL precharging varies, the operation in which the verify voltage rises Vvf rising and the operation in which the bit line is precharged BL precharging may be performed for a uniform time period. Accordingly, the earlier the start time of the operation in which the verify voltage rises Vvf rising and the operation in which the bit line is precharged BL precharging is, the earlier the end time, which is one of the times T1', T2', T3', and T4', of the operation in which the verify voltage rises Vvf rising and the operation in which the bit line is precharged BL precharging is. The end time, which is one of the times T1', T2', T3', and T4', of the operation in which the verify voltage rises Vvf rising and the operation in which the hit line is precharged BL precharging may be a start time of the operation of sensing sensing. Because the operation of sensing sensing is performed for a uniform time period, the earlier the start time, which is one of the times T1', T2', T3', and T4', of the operation of sensing sensing as, the earlier an end time, which is one of the times T1", T2", T3", and T4", of the operation of sensing sensing is. Similarly, the later the start time, which is one of the times T1', T2', T3', and T4', of the operation of sensing sensing is, the later the end time, which is one of the times T1", T2", T3", and T4", of the operation of sensing sensing is.

As described above, as the program operations of cell pages coupled to the selected word line Sel_WL proceed and the number of cell pages on which the program operation is performed increases, the number of memory cells in an erase state decreases. Accordingly, the end time of the operation of sensing sensing may also be gradually advanced, thereby reducing a program operation time of selected cell pages.

Figure 14:
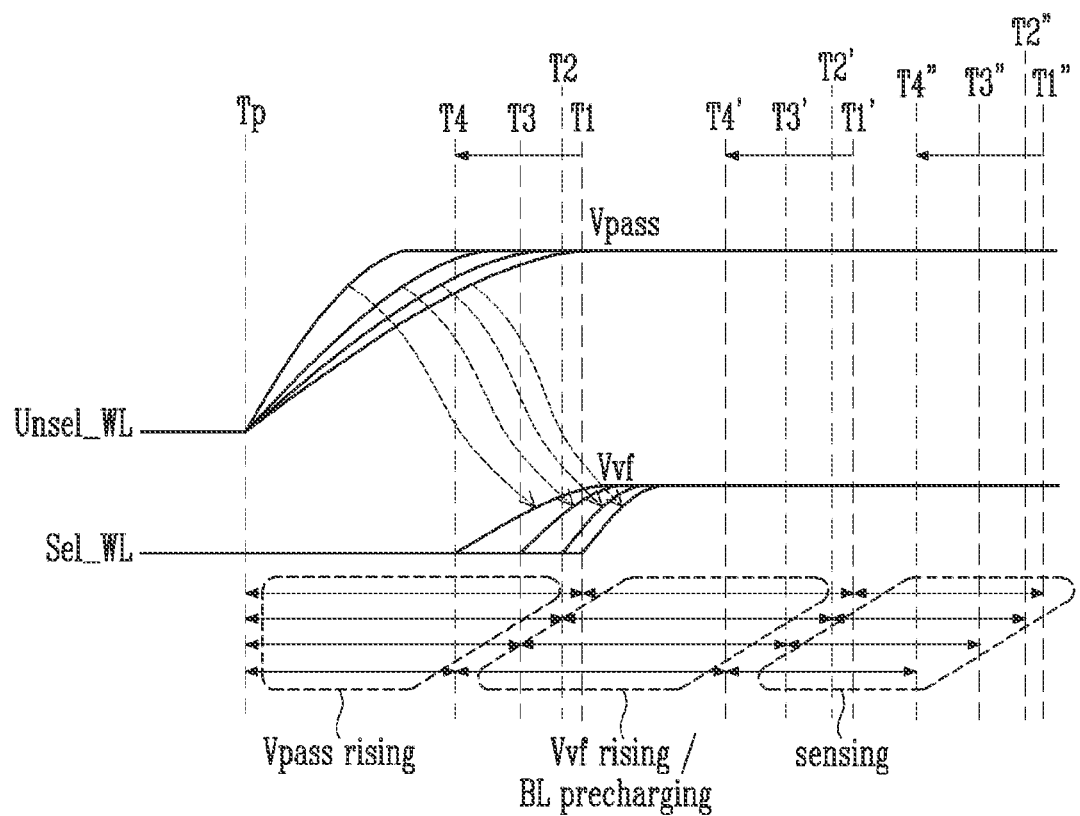
FIG. 14 is a diagram illustrating a method of operating a memory device according to a third embodiment.

FIG. 14 is a diagram illustrating a method of operating a memory device according to a third embodiment.

Referring to FIG. 14, in a verify operation according to the third embodiment, the first to fourth times T1, T2, T3, and T4 at which the verify voltage Vvf is applied to the selected word line Sel_WL may be set to be gradually earlier from the time Tp at which the pass voltage Vpass starts to be applied to the unselected word lines Unsel_WL each time a selected cell page is changed.

In the verify operation according to the third embodiment, when it is assumed that an interval between the first time T1 and the second time T2 is the smallest among intervals between adjacent times among the first to fourth times T1, T2, T3, and T4, an interval between the second time T2 and the third time T3 may be greater than the interval between the first time T1 and the second time T2 and an interval between the third time T3 and the fourth time T4 may be greater than the interval between the second time T2 and the third time T3.

When the operation in which the verify voltage rises Vvf rising and the operation in which the bit line is precharged BL precharging start at a time selected among the first to fourth times T1 to T4, an end time may vary depending on a start time. For example, after the pass voltage Vpass is applied to the unselected word lines Unsel_WL, the verify voltage Vvf may be applied to the selected word line Sel_WL and a precharge voltage may be applied to the bit lines BL at the first time T1. When the precharge voltage is applied to the bit lines BL, a turn-on voltage may be applied to a drain selection line corresponding to a selected cell page. A voltage which enables drain selection transistors coupled to the drain selection line to be turned on may be set as the turn-on voltage.

Even when the start time of the operation in which the verify voltage rises Vvf rising and the operation in which the bit line is precharged BL precharging varies, the operation in which the verify voltage rises Vvf rising and the operation in which the bit line is precharged BL precharging may be performed for a uniform time period. Accordingly, the earlier the start time of the operation in which the verify voltage rises Vvf rising and the operation in which the bit line is precharged BL precharging is, the earlier the end time, which is one of the times T1', T2', T3', and T4', of the operation in which the verify voltage rises Vvf rising and the operation in which the bit line is precharged BL precharging is. The end time, which is one of the times T1', T2', T3', and T4', of the operation in which the verify voltage rises Vvf rising and the operation in which the bit line is precharged BL precharging may be a start time of the operation of sensing sensing. Because the operation of sensing sensing is performed for a uniform time period, the earlier the start time, which is one of the times T1', T2', T3', and T4', of the operation of sensing sensing is, the earlier an end time, which is one of the times T1", T2", T3", and T4", of the operation of sensing sensing is. Similarly, the later the start time, which is one of the times T1', T2', T3', and T4', of the operation of sensing sensing is, the later the end time, which is one of the times T1", T2", T3", and T4", of the operation of sensing sensing is.

As described above, as the program operations of cell pages coupled to the selected word line Sel_WL proceed and the number of cell pages on which the program operation is performed increases, the number of memory cells in an erase state decreases. Accordingly, the end time of the operation of sensing sensing may also be gradually advanced, thereby reducing a program operation time of selected cell pages.

The first, second, and third embodiments are described with reference to FIGS. 12, 13, and 14, respectively. However, a method of setting a time point at which the verify voltage Vvf is applied to the selected word line Sel_WL is not limited to methods described in the first to third embodiments and may be variously implemented.

According to the above-described embodiments, a time point at which the verify voltage Vvf is applied to the selected word line Sel_WL varies depending on the number of memory cells in an erase state or an order of performing program operations. However, a time point at which the verify voltage Vvf is applied to the selected word line Sel_WL may also vary according to sizes of memory cells. This is described below in detail.

Figure 15:
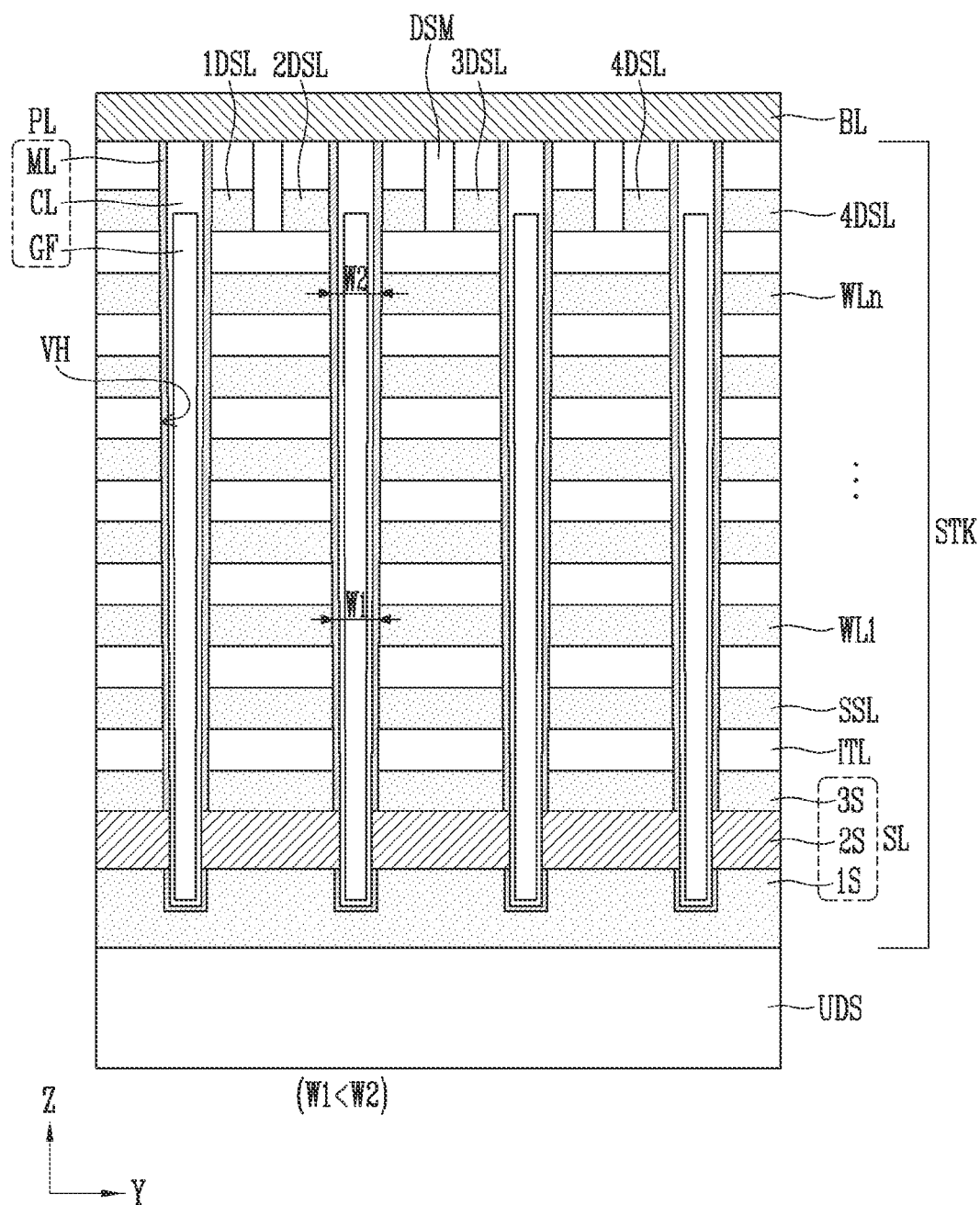
FIG. 15 is a diagram illustrating a structure of a memory block.

FIG. 15 is a diagram illustrating a structure of a memory block.

Referring to FIG. 15, the memory block may include a stacked structure STK formed on a lower structure UDS. The lower structure UDS may be a substrate or a peripheral circuit. The stacked structure STK may include the source line SL, the source selection line SSL, the first to nth word lines WL1 to WLn, the drain selection lines 1DSL, 2DSL, 3DSL, and 4DSL, plugs PL, and interlayer insulating layers ITL that are stacked over the lower structure UDS. The bit line BL may be formed over the stacked structure STK.

The first to nth word lines WL1 to WLn included in the stacked structure STK may be staked between the source line SL and the drain selection lines 1DSL, 2DSL, 3DSL, and 4DSL, FIG. 15 illustrates that the source line SL includes first, second, and third source layers 1S, 2S, and 3S. However, the number of source layers included in the source line SL is not limited to the number of source layers illustrated in FIG. 15. The drain selection lines 1DSL, 2DSL, 3DSL, and 4DSL may be formed between the nth word line WLn and the bit line BL and may be divided by drain isolation layers DSM.

The plugs PL may be formed to vertically penetrate the interlayer insulating layers ITL, the drain selection lines 1DSL, 2DSL, 3DSL, and 4DSL, and the source line SL. The plugs PL may be formed in vertical holes VH that vertically penetrate the interlayer insulating layers ITL, the drain selection lines 1DSL, 2DSL, 3DSL, and 4DSL, and the source line SL. For example, each of the plugs PL may include a memory layer ML formed along an inner wall of each of the vertical holes VH, a channel layer CL formed along an inner wall of the memory layer ML, and a gap-fill layer GF formed in an inner region of the channel layer CL. Although not illustrated in FIG. 15, each of the plugs PL may include a blocking layer, a charge trapping layer, and a tunnel insulating layer.

Due to characteristics of an etching process for forming the vertical holes VH, a width of each of the vertical holes VH may decreases in the direction toward a lower portion of the vertical holes VH. Accordingly, a width of each of the plugs PL may also decrease in the direction toward a lower portion of the plugs PL. For example, when a part of each of the plugs PL corresponding to the first word line WL1 has a first width ill, a part of each of the plugs PL corresponding to the nth word line WLn may have a second width W2 greater than the first width W1. When the width of each of the plugs PL decreases, a width of the memory layer ML included in each of the plugs PL may also decrease, and when the width of each of the plugs PL increases, the width of the memory layer ML included in each of the plugs PL may also increase. Electrical effects of word lines on memory cells in an erase state may increase as a width of each of the memory cells increases. Accordingly, in fourth and fifth embodiments to be described below, a time point at which a pass voltage is applied to unselected word lines may be adjusted depending on a width of each of the plugs PL or each of the memory cells.

Figure 16:
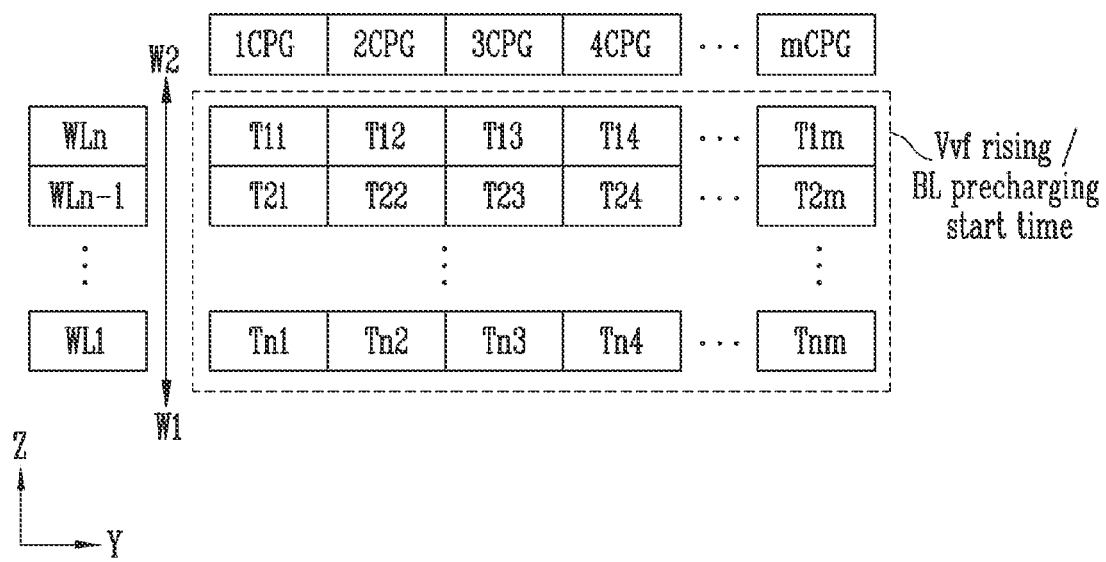
FIG. 16 is a diagram illustrating a method of operating a memory device according to a fourth embodiment.

FIG. 16 is a diagram illustrating a method of operating a memory device according to the fourth embodiment.

Referring to FIG. 16, a verify operation may be set such that the less a width of each of memory cells is, the earlier a time point at which the verify voltage Vvf is applied to the selected word lines is. For example, when it is assumed that the first word line WL1 is disposed at the lowermost level among word lines and the nth word line WLn is disposed at the uppermost level among the word lines, a width of each of the memory cells coupled to the first word Brae WL1 is the smallest and a width of each of the memory cells coupled to the nth word line WLn is the greatest among memory cells coupled to the word lines. During a verify operation of a memory block having the above-described structure, a time point at which the verify voltage Vvf is applied to the selected word lines may be set to be earlier in the direction away from the nth word line WLn toward the first word line WL1.

In other words, because widths of memory cells in the cell pages 1CPG to mCPG coupled to the same word line are the same, the time point at which the verify voltage Vvf is applied to the selected word lines may be adjusted depending on the number of memory cells in an erase state. Unlike the cell pages 1CPG to mCPG arranged in the second direction Y, because widths of memory cells in the cell pages 1CPG, 2CPG, 3CPG or 4CPG stacked in the third direction Z to be coupled to different word lines are different, the time point at which the verify voltage Vvf is applied to the selected word lines may be adjusted depending on the widths of the memory cells. For example, because the width of each of the memory cells coupled to the nth word line WLn is the greatest, during a verify operation of the first cell page 1CPG coupled to the nth word line WLn, it is assumed that a time point at which the verify voltage Vvf is applied to the selected word line is an eleventh time T11. When the (n-1)th word line WLn-1 is arranged below the nth word line WLn, a width of each of memory cells of the first cell page 1CPG coupled to the (n-1)th word line WLn-1 is smaller than the width of each of the memory cells of the first cell page 1CPG coupled to the nth word line WLn. Accordingly, in the verify operation performed in the first cell page 1CPG coupled to the (n-1)th word line WLn-1, the verify voltage Vvf may be set to be applied to the selected word line at a twenty-first time 121 earlier than the eleventh time T11. When program operations of the first to mth cell pages 1CPG to mCPG coupled to the (n-1)th word line WLn-1 are sequentially performed in the second direction Y, the verify voltage Vvf may be set to be applied at a twenty-second time T22 earlier than the twenty-first time T21 in the second cell page 2CPG coupled to the (n-1)th word line WLn-1. In the above-described manner, the verify voltage Vvf may be set to start to be applied at twenty-first to 2mth times T21 to T2m in the first to mth cell pages 1CPG to mCPG coupled to the (n-1)th word line WLn-1. The twenty-first time T21 may be the last time and the 2mth time T2m may be the earliest time among the twenty-first to 2mth times T21 to T2m.

In the fourth embodiment, the verify voltage Vvf may be applied to the selected word line at the same time when the operation in which the bit line is precharged BL precharging is performed.

Similarly to the eleventh to 1mth times T11 to Tim respectively set for the first to mth cell pages 1CPG to mCPG coupled to the nth word line WLn, the twenty-first to 2mth times T21 to T2m may be respectively set for the first to mth cell pages 1CPG to mCPG coupled to the (n-1)th word line WLn-1. The twenty-first to 2mth times T21 to T2m are respectively earlier than the eleventh to 1mth times T11 to Tim and intervals between adjacent times among the twenty-first to 2mth times T21 to T2m may be the same as intervals between adjacent times among the eleventh to 1mth times T11 to Tim.

In the above-described manner, program operations of cell pages coupled to each of the first to nth word lines WL1 to WLn may be performed.

Figure 17:
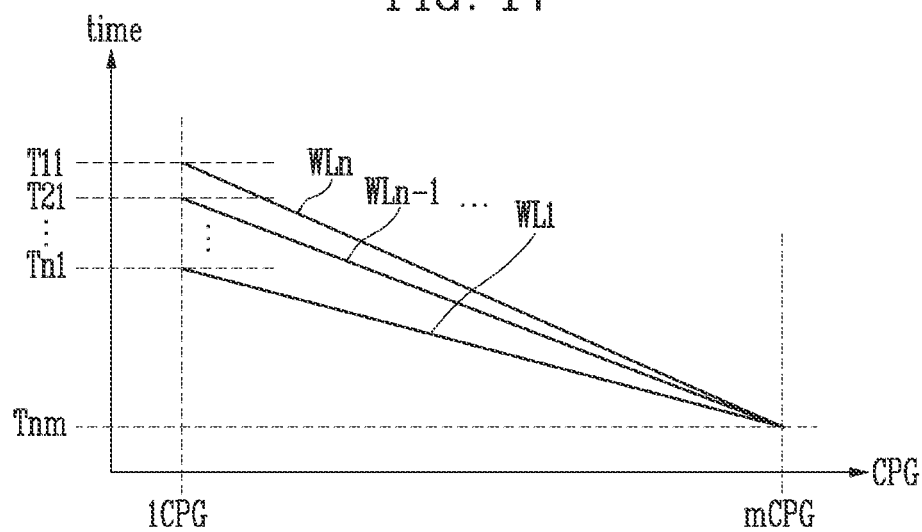
FIG. 17 is a diagram illustrating a method of operating a memory device according to a fifth embodiment.

FIG. 17 is a diagram illustrating a method of operating a memory device according to the fifth embodiment.

Referring to FIG. 17, in a verify operation according to the fifth embodiment, time points at which the verify voltage Vvf starts to be applied to the selected word line Sel_WL may be set such that intervals between adjacent time points among the time points gradually decrease. For example, when a width of a plug or a memory cell decreases, an interval between adjacent time points at which the verify voltage Vvf is applied to the selected word line may gradually decrease. Accordingly, among the cell pages 1CPG to mCPG coupled to each of different word lines, time points at which the verify voltage is applied may be differently set among the times T11 to Tn1 in the first cell pages 1CPG depending on different widths of memory cells, and time points at which the verify voltage is applied may be set to be the same, that is, a time Tnm, in the mth cell pages mCPG among the cell pages 1CPG to mCPG.

Figure 18:
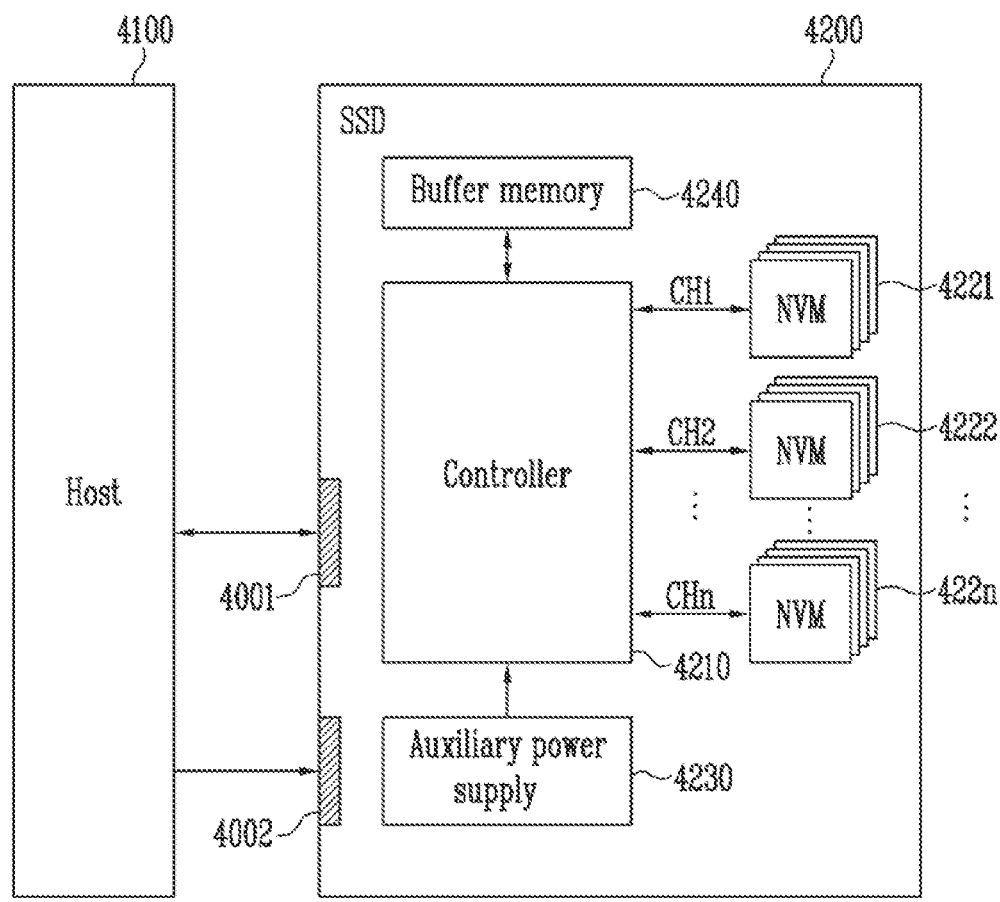
FIG. 18 is a diagram illustrating a Solid State Drive (SSD) system to which a memory device according to an embodiment is applied.

FIG. 18 is a diagram illustrating a Solid State Drive (SSD) system 4000 to which a memory device according to an embodiment is applied.

Referring to FIG. 18, the SSD system 4000 may include a host 4100 and an SSD 4200. The SSD 4200 may exchange signals with the host 4100 through a signal connector 4001 and may receive power through a power connector 4002. The SSD 4200 may include a controller 4210, a plurality of flash memory 4221 to 422n, an auxiliary power supply 4230, and buffer memory 4240.

According to an embodiment, each of the plurality of flash memories 4221 to 422n may have the same configuration as the memory device 1100 described above with reference to FIG. 1.

The controller 4210 may control the plurality of flash memories 4221 to 422n in response to the signals received from the host 4100. In an embodiment, the signals may be based on interfaces of the host 4100 and the SSD 4200. For example, the signals may be defined by at least one of various interfaces such as Universal Serial Bus (USB), multimedia card (MMC), embedded MMC (eMMC), peripheral component interconnect (PCI), PCI-express (PCI-e), Advanced Technology Attachment (ATA), Serial-ATA (SATA), Parallel-ATA (DATA), Small Computer System Interface (SCSI), Enhanced Small Disk Interface (ESDI), Integrated Drive Electronics (IDE), Firewire, Universal Flash Storage (UFS), WiFi, Bluetooth, and nonvolatile memory express (NVMe) interfaces.

The auxiliary power supply 4230 may be coupled to the host 4100 through the power connector 4002. The auxiliary power supply 4230 may be supplied and charged with a power voltage from the host 4100. The auxiliary power supply 4230 may supply the power voltage to the SSD 4200 when power is not smoothly supplied from the host 4100. In an embodiment, the auxiliary power supply 4230 may be disposed within or external to the SSD 4200. For example, the auxiliary power supply 4230 may be disposed on a main board and may supply auxiliary power to the SSD 4200.

The buffer memory 4240 may serve as buffer memory of the SSD 4200. For example, the buffer memory 4240 may temporarily store data received from the host 4100 or data received from the plurality of flash memory 4221 to 422n, or may temporarily store metadata (e.g., mapping tables) of the plurality of flash memory 4221 to 422n. The buffer memory 4240 may include volatile memory such as DRAM, SDRAM, DDR SDRAM, and LPDDR SDRAM or nonvolatile memory such as FRAM, ReRAM, STT-MRAM, and PRAM.

Figure 19:
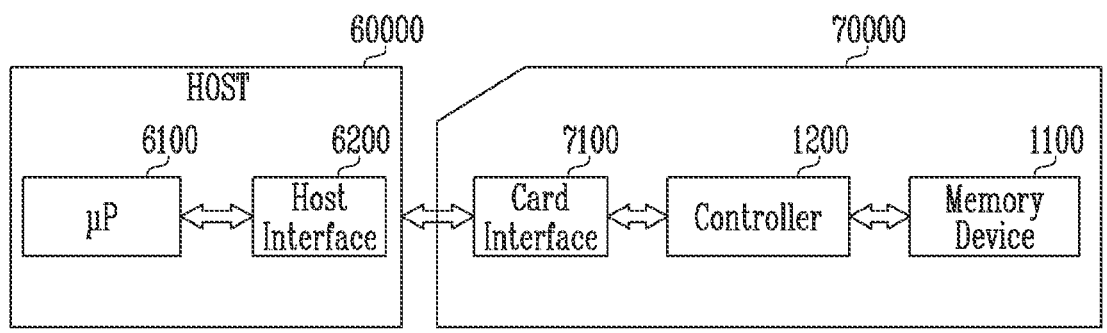
FIG. 19 is a diagram illustrating a memory card system to which a memory device according to an embodiment is applied.

FIG. 19 is a diagram illustrating a memory card system to which a memory device according to an embodiment is applied.

Referring to FIG. 19, a memory system 70000 may be embodied as a memory card or a smart card. The memory system 70000 may include the memory device 1100, a controller 1200, and a card interface 7100.

The memory device 1100 may have the same configuration as the memory device 1100 shown in FIG.

The controller 1200 may control data exchange between the memory device 1100 and the card interface 7100. According to an embodiment, the card interface 7100 may be, but is not limited to, a secure digital (SD) card interface or a multi-media card (MMC) interface.

The card interface 7100 may interface data exchange between a host 60000 and the controller 1200 according to a protocol of the host 60000. According to an embodiment, the card interface 7100 may support a Universal Serial Bus (USB) protocol or an InterChip (IC)-USB protocol. The card interface 7100 may refer to hardware that supports a protocol used by the host 60000, software mounted on the hardware, or a signal transmission method.

When the memory system 70000 is connected to an host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 in response to control of a microprocessor (μP) 6100.

According to embodiments of the present disclosure, reliability of a three-dimensionally structured memory device may be improved.

According to embodiments of the present disclosure, reliability of a verify operation that is performed in a program operation of the memory device may be improved.

What is claimed is:

1. A memory device, comprising:
a memory block in which a plurality of cell pages are coupled to each of word lines;
a peripheral circuit configured to adjust a time point at which a verify voltage is applied to a selected word line among the word lines according to an order of performing a program operation during a verify operation of a selected cell page; and
a control logic circuit configured to transmit, to the peripheral circuit, an operation code for adjusting the time point at which the verify voltage is output.

2. The memory device of claim 1, wherein the cell pages are a group of memory cells that are coupled to a same word line.

3. The memory device of claim 2, wherein the cell pages that are coupled to the same word line are selected by drain selection transistors that are coupled between the cell pages and bit lines.

4. The memory device of claim 1, wherein, during a verify operation of a selected cell page among the cell pages that are coupled to a same word line, the control logic circuit outputs operation codes such that the earlier the order of performing the program operation is, the later the time point at which the verify voltage is applied to the selected word line is set.

5. The memory device of claim 4, wherein the control logic circuit includes a voltage controller configured to output the operation codes according to the order of performing the program operation.

6. The memory device of claim 5, wherein the operation codes output by the voltage controller comprise:
a level code for setting a level of the verify voltage; and
a time code for setting the time point at which the verify voltage is output.

7. The memory device of claim 6, wherein the peripheral circuit comprises:
a generator configured to generate the verify voltage in response to the level code; and
an output switch configured to output the verify voltage generated by the generator at a time point set based on the time code.

8. The memory device of claim 1, wherein the peripheral circuit includes page buffers configured to apply a precharge voltage to bit lines when the verify voltage is applied to the selected word line.

9. A method of operating a memory device, the method comprising:
applying a program voltage to a selected word line to increase a threshold voltage of selected memory cells among a plurality of memory cells that are coupled to the selected word line;
applying a pass voltage to unselected word lines during a verify operation for sensing a state of the selected memory cells;
adjusting, after applying the pass voltage, a time point at which a verify voltage is applied to the selected word line according to an order of performing a program operation of the selected memory cells; and
applying the verify voltage to the selected word line according to the time point that is adjusted.

10. The method of claim 9, wherein, in adjusting the time point at which the verify voltage is applied to the selected word line, the time point at which the verify voltage is applied to the selected word line is a time point at which the verify voltage starts to be applied to the selected word line.

11. The method of claim 9, wherein, in adjusting the time point at which the verify voltage is applied to the selected word line, the earlier the program operation is performed, the later the time point is set, and the later the program operation is performed, the earlier the time point is set.

12. The method of claim 11, wherein time points at which the verify voltage is applied to the selected word line and which are respectively set for groups of memory cells on which orders of performing the program operation are different among the selected memory cells are set such that intervals between the time points that are adjacent to each other are the same.

13. The method of claim 11, wherein time points at which the verify voltage is applied to the selected word line and which are respectively set for groups of memory cells on which orders of performing the program operation are different among the selected memory cells are set such that intervals between the time points that are adjacent to each other decrease as a number of memory cells in an erase state decreases.

14. The method of claim 11, wherein time points at which the verify voltage is applied to the selected word line and which are respectively set for groups of memory cells on which orders of performing the program operation are different among the selected memory cells are set such that intervals between the time points that are adjacent to each other increase as a number of memory cells in an erase state decreases.

15. The method of claim 9, wherein, when the selected word line is changed, the time point at which the verify voltage is applied to the selected word line is maintained.

16. The method of claim 9, further comprising adjusting a time point at which the verify voltage is applied to the selected word line depending on a width of each of the plurality of memory cells that are coupled to the selected word line.

17. The method of claim 16, wherein the time point at which the verify voltage is applied to the selected word line is set to be earlier as the width of each of the plurality of memory cells decreases.

18. The method of claim 16, wherein time points at which the verify voltage is applied to the selected word line are set such that intervals between the time points that are adjacent to each other decrease as the width of each of the plurality of memory cells decreases.

19. The method of claim 9, wherein a precharge voltage is applied to bit lines coupled to the plurality of memory cells when the verify voltage is applied to the selected word line.

* * * * *